United States Patent
Lin et al.

(10) Patent No.: US 11,532,658 B2
(45) Date of Patent: Dec. 20, 2022

(54) IMAGE SENSOR GRID AND METHOD OF FABRICATION OF SAME

(71) Applicant: TAIWAN SEMICONDUCTOR MANUFACTURING CO., LTD., Hsinchu (TW)

(72) Inventors: Chin-Yu Lin, Taichung (TW); Keng-Ying Liao, Tainan (TW); Su-Yu Yeh, Tainan (TW); Po-Zen Chen, Tainan (TW); Huai-Jen Tung, Tainan (TW); Hsien-Li Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 217 days.

(21) Appl. No.: 16/746,720

(22) Filed: Jan. 17, 2020

(65) Prior Publication Data
US 2021/0225918 A1 Jul. 22, 2021

(51) Int. Cl.
*H01L 27/146* (2006.01)

(52) U.S. Cl.
CPC .... *H01L 27/14629* (2013.01); *H01L 27/1464* (2013.01); *H01L 27/14621* (2013.01); *H01L 27/14627* (2013.01); *H01L 27/14636* (2013.01); *H01L 27/14645* (2013.01); *H01L 27/14687* (2013.01); *H01L 27/14689* (2013.01)

(58) Field of Classification Search
None
See application file for complete search history.

(56) References Cited

U.S. PATENT DOCUMENTS

| | | | |
|---|---|---|---|
| 9,443,899 B1* | 9/2016 | Liu | H01L 27/1464 |
| 10,498,947 B2* | 12/2019 | Cheng | H04N 9/04555 |
| 2012/0049306 A1 | 3/2012 | Ohba et al. | |
| 2014/0043497 A1 | 2/2014 | Tanikuni et al. | |
| 2016/0276394 A1* | 9/2016 | Chou | H01L 27/14636 |
| 2016/0307950 A1 | 10/2016 | Huang et al. | |
| 2017/0077163 A1 | 3/2017 | Chug et al. | |
| 2017/0110501 A1* | 4/2017 | Hsu | H01L 27/14645 |
| 2019/0165009 A1 | 5/2019 | Wu et al. | |

FOREIGN PATENT DOCUMENTS

| | | |
|---|---|---|
| CN | 103579270 A | 2/2014 |
| CN | 105355639 A | 2/2016 |
| CN | 105990384 A | 10/2016 |
| CN | 106057838 A | 10/2016 |
| CN | 106876420 A | 6/2017 |
| CN | 112117287 A | 12/2020 |
| TW | 201719875 A | 6/2017 |
| TW | 201926573 A | 7/2019 |

* cited by examiner

*Primary Examiner* — Ali Naraghi
(74) *Attorney, Agent, or Firm* — Maschoff Brennan (57) ABSTRACT

An image sensor structure includes a semiconductor device, a plurality of image sensing elements formed in the semiconductor substrate, an interconnect structure formed on the semiconductor substrate, and a composite grid structure over the semiconductor substrate. The composite grid structure includes a tungsten grid, an oxide grid over the tungsten grid, and an adhesion enhancement grid spacing the tungsten grid from the oxide grid.

20 Claims, 12 Drawing Sheets

IMAGE SENSOR GRID AND METHOD OF FABRICATION OF SAME

BACKGROUND

Integrated circuits (IC) with image sensors are used in a wide range of modern day electronic devices. In recent years, complementary metal-oxide semiconductor (CMOS) image sensors have begun to see widespread use, largely replacing charge-coupled devices (CCD) image sensors. Compared to CCD image sensors, CMOS image sensors are increasingly favored due to low power consumption, a small size, fast data processing, a direct output of data, and low manufacturing cost. Some types of CMOS image sensors include front-side illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensor (CIS) comprises a plurality of pixel regions respectively having an image sensing element, such as a photodiode. Backside illuminated (BSI) CMOS image sensors (BSI-CISs) are semiconductor devices capable of efficiently capturing photons and generating a corresponding electrical signal. BSI-CIS devices are used for consumer electronics, among other applications, and are replacing front-side illumination sensors because they have a higher efficiency, offer higher resolution, and may reduce fabrication costs. To form BSI sensors, image sensing elements, such as photodiodes, are formed in a substrate along with logic circuits and interconnect structures. BSI sensors may generate electrical signals in response to the stimulation of photons that reach the image sensing elements through back-side of the substrate.

The magnitudes of the electrical signals (e.g., current signals) depend on the intensity of the incident light received by the respective photo-detecting devices. BSI sensors may be fabricated as matrices of image sensing elements. The signal outputs of these sensors may be aggregated to generate digital, pixelated images. Over time, the semiconductor industry has reduced a size of pixel regions, so as to increase a number of pixel regions in a BSI-CIS integrated chip. Increasing the number of pixel regions in a BSI-CIS integrated chip increases the resolution of an image captured by the BSI-CIS integrated chip. However, as the size of the pixel regions gets smaller, the pixel regions come closer together and crosstalk between neighboring pixel regions increases.

To reduce optical cross-talk between pixel regions and/or to improve resolution of the image captured by the BSI-CIS integrated chip, the light received by different image sensing elements in a matrix may be passed through a composite grid structure, normally formed of a metal grid and a oxide grid stacked upon the metal grid, designed to isolate the light and/or to filter certain frequencies. Robustness of the composite grid structure is desirable to minimize or prevent light loss that may degrade the quantum efficiency (QE) (e.g., photon to electron conversion percentage), angular response and signal-to-noise ratio of 10 dB (SNR10) of the BSI image sensors. However, adhesion strength between the oxide grid and the metal grid decreases as a critical dimension (CD) of gridlines decreases, which in turn would lead to peeing defects in the composite grid structure, thus degrading the robustness of the composite grid structure. In some embodiments of the present disclosure, an additional adhesion enhancement layer is interposed between the oxide grid and the metal grid, so as to provide improved adhesion strength to the metal grid and the oxide grid. As a result, peeling defects in the composite grid structure can be mitigated, even if the gridlines have a scaled-down critical dimension.

FIGS. 1-8 illustrate a method of fabricating a composite grid structure for a backside CMOS image sensor (BSI-CIS) structure according to various embodiments of the present disclosure. The steps shown in FIGS. 1 through 8 are also reflected schematically in the process flow shown in FIG. 9.

Throughout the various views and illustrative embodiments, like reference numbers are used to designate like elements. It is understood that additional operations can be provided before, during, and after the processes shown by FIGS. 1-8, and some of the operations described below can be replaced or eliminated, for additional embodiments of the method. The order of the operations/processes may be interchangeable.

Figure 1:
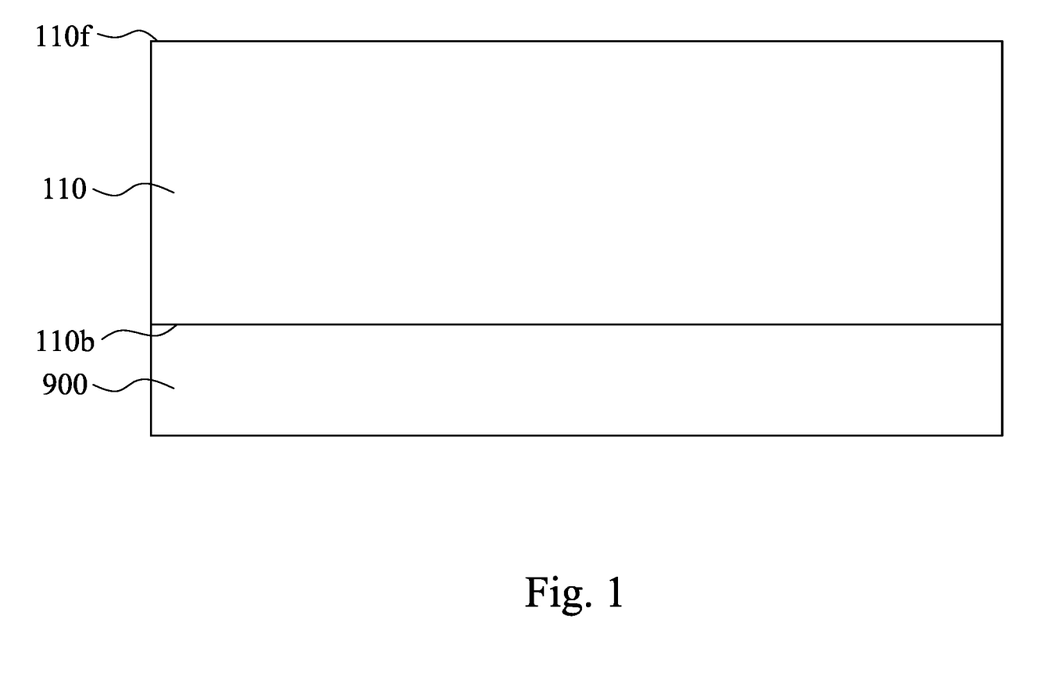
FIGS. 1-5 are cross-sectional views of various intermediate stages of fabricating a backside illuminated (BSI) CMOS image sensor (BSI-CIS) structure according to various embodiments of the present disclosure.

FIG. 1 illustrates a substrate 110 with a front-side 110f and a backside 110b bonded to a support substrate 900. In the depicted embodiment, the substrate 110 may be a semiconductor substrate including silicon. Alternatively, or additionally, the substrate 110 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlIn As, AlGaAs, GanAs, GanP, and/or GanASP; or combinations thereof. The substrate 110 may be a semiconductor on insulator (SOI). In some embodiments, the substrate 110 may include a doped epi layer, a gradient semiconductor layer, and/or a semiconductor layer overlying another semiconductor layer of a different type, such as a silicon layer on a silicon germanium layer. In some embodiments, the substrate 110 may be thinned by etching and/or mechanical grinding a front-side 110f of the substrate 110 after bonding to the support substrate 900. Thinning the substrate 110 allows for radiation to pass more easily to image sensing elements subsequently formed within the substrate 110.

Figure 2:
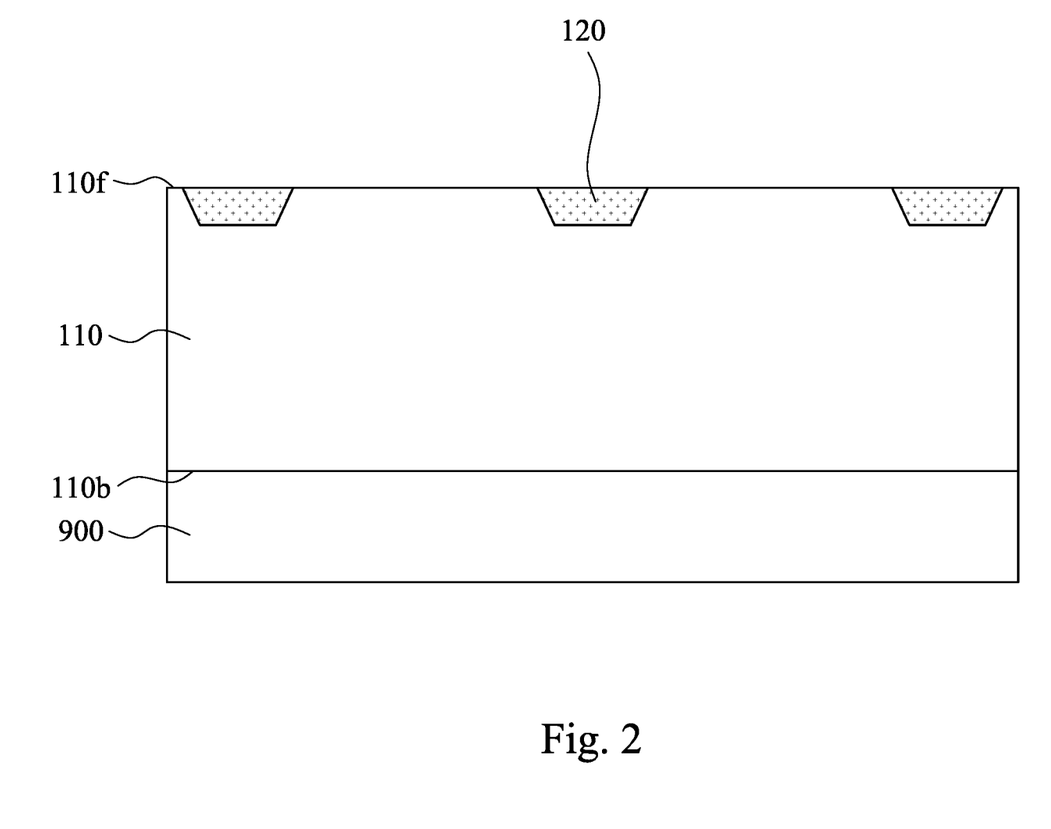

Reference is made to FIG. 2. One or more isolation features 120 are formed within the front-side 110f of the substrate 110. The isolation features 120 include shallow trench isolation (STI) structures and/or local oxidation of silicon (LOCOS) structures. The isolation features 120 may include silicon oxide, silicon nitride, silicon oxynitride, other suitable materials, or combinations thereof. The isolation features 120 may be formed by any suitable process. For example, forming STI structures 120 includes etching trenches in the front-side 110f in the substrate 110 (for example, by using a dry etching and/or wet etching), and filling the trench (for example, by using a chemical vapor deposition process) with one or more dielectric materials (e.g., SiO$_2$). A chemical mechanical polishing (CMP) process may be performed to planarize the isolation features 120 with the front-side 110f of the substrate 110.

Figure 3:
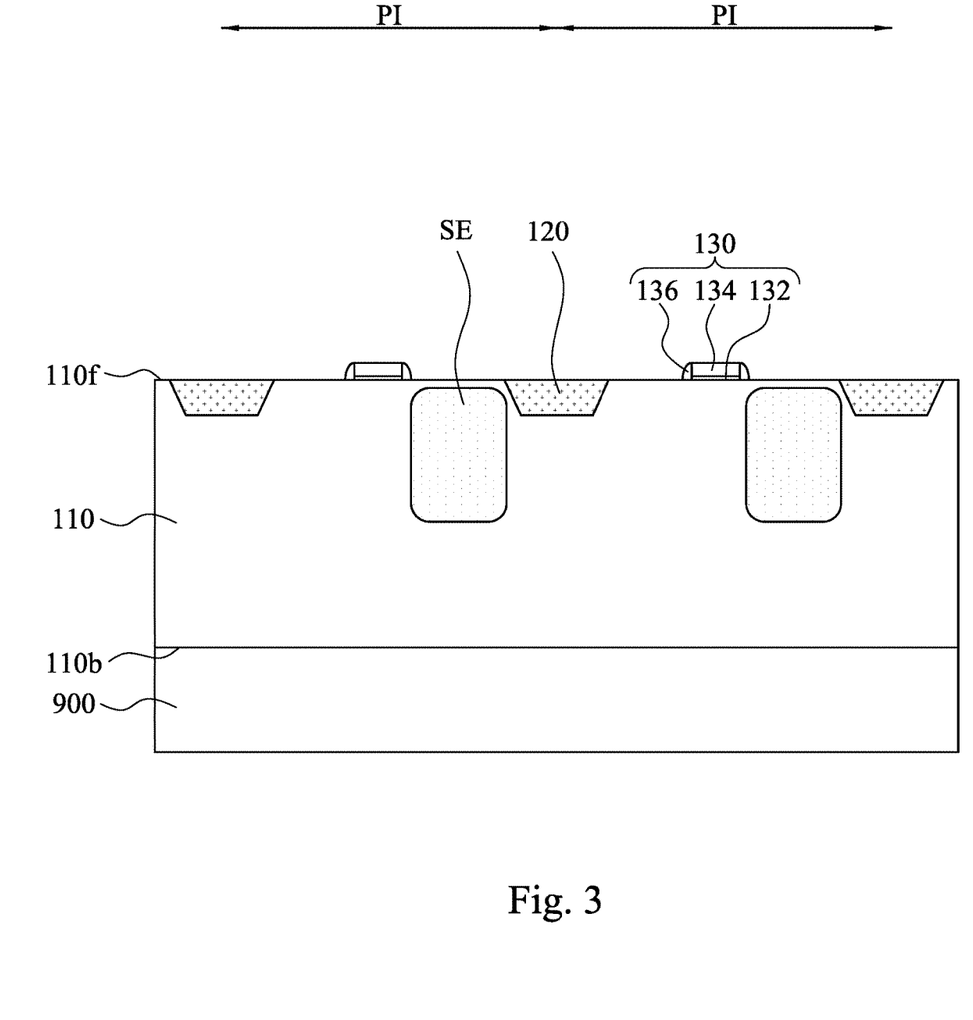

Reference is made to FIG. 3. Image sensing elements SE are formed within respective pixel regions PI of the substrate 110. The image sensing elements SE detect an intensity (brightness) of radiation directed toward the backside 110b of the substrate 110. In some embodiments, the image sensing elements SE may be configured to detect visible light. Alternatively, the image sensing elements SE may be configured to detect infrared (IR), ultraviolet (UV), X-ray, microwave, other radiation types, or combinations thereof. Moreover, in certain embodiments, the image sensing elements SE may be configured to exhibit sensitivity to particular light wavelengths, such as red (R), green (G), or blue (B) wavelengths. In such cases, the image sensing elements SE may be configured to detect an intensity (brightness) of light having a particular wavelength. The image sensing elements SE may be arranged as pixels in a pixel array.

In some embodiments, the image sensing elements SE may include photodetectors, such as photodiodes, which detect intensity (brightness) of different wavelengths. For example, the image sensing elements SE may include photodiodes to detect red, green, and/or blue light wavelengths. In such embodiments, the image sensing elements SE may include doped regions having n-type and/or p-type dopants formed in the substrate 110, for example, by implanting one or more dopant species through the front-side 110f of the substrate 110. For example, the image sensing elements SE (e.g., photodiodes) may be formed by selectively performing a first implantation process (e.g., according to a masking layer) to form first regions having a first doping type (e.g., n-type), and subsequently performing a second implantation process to form second regions abutting the respective first regions and having a second doping type (e.g., p-type) different than the first doping type, thus resulting PN junctions, which function as photodiodes SE in the substrate 110. In some embodiments, a floating diffusion well (not shown) may also be formed using one of the first or second implantation processes.

One or more transistor gate structures 130 are formed over the front-side 110f of the substrate 110 within the pixel regions PI. In various embodiments, the one or more transistor gate structures 130 may of a transfer transistor, a source-follower transistor, a row select transistor, and/or a reset transistor of a BSI-CIS integrated chip. In some embodiments, the one or more transistor gate structures 130 may be formed by depositing a gate dielectric film and a gate electrode film on the front-side 110f of the substrate 110. The gate dielectric film and the gate electrode film are subsequently patterned to form a gate dielectric layer 132 and a gate electrode 134 over the gate dielectric layer 132. Sidewall spacers 136 may be formed along the outer sidewalls of the gate electrode 134. In some embodiments, the sidewall spacers 136 may be formed by depositing a spacer layer (e.g., a nitride, an oxide, etc.) onto the front-side 110f of the substrate 110 and anisotropically etching the spacer layer to form the sidewall spacers 136. Formation of the photodiodes and the transistors including respective gate structures 130 can be referred to as a front-end-of-line (FEOL) process.

Figure 4:
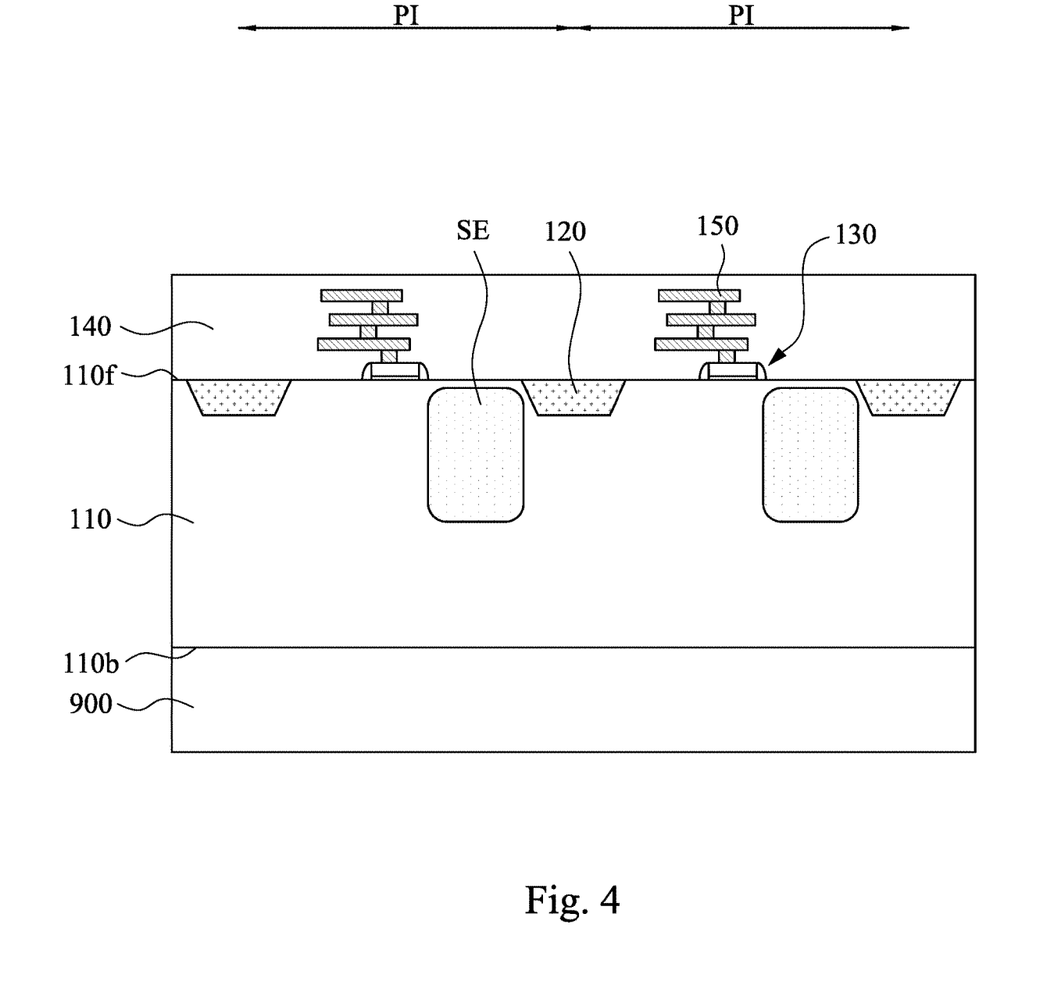

Reference is made to FIG. 4. Conductive interconnect layers 150 are formed within a dielectric structure 140 formed over the front-side 110f of the substrate 110. Formation of the dielectric structure 140 and the conductive interconnect layers 150 can be referred to as a back-end-of-line (BEOL) process, and the dielectric structure 140 and the conductive interconnect layers 150 can be in combination referred to as an interconnect structure. The dielectric structure 140 includes multiple stacked interlayer dielectric (ILD) layers, while the conductive interconnect layers 150 include alternating layers of conductive wires and vias (e.g., laterally extending metal wires and vertically extending metal vias). In some embodiments, one or more of conductive interconnect layers 150 may be formed using a damascene process (e.g., a single damascene process or a dual damascene process). The damascene process is performed by depositing an ILD layer over the front-side 110f of the substrate 110, etching the ILD layer to form a via hole and/or a trench, filling the via hole and/or trench with a conductive material (e.g., metal), and planarizing excess conductive material outside the via hole and/or trench using, for example, a chemical mechanical polishing (CMP) process. In some embodiments, the ILD layer may be deposited by a physical vapor deposition technique (e.g., physical vapor deposition (PVD), chemical vapor deposition (CVD), plasma enhanced CVD (PECVD), atomic layer deposition (ALD), etc.) and the conductive material may be formed using a deposition process and/or a plating process (e.g., electroplating, electroless plating, etc.). In various embodiments, the conductive interconnect layers 150 may include tungsten, copper, or aluminum copper, for example.

Figure 5:
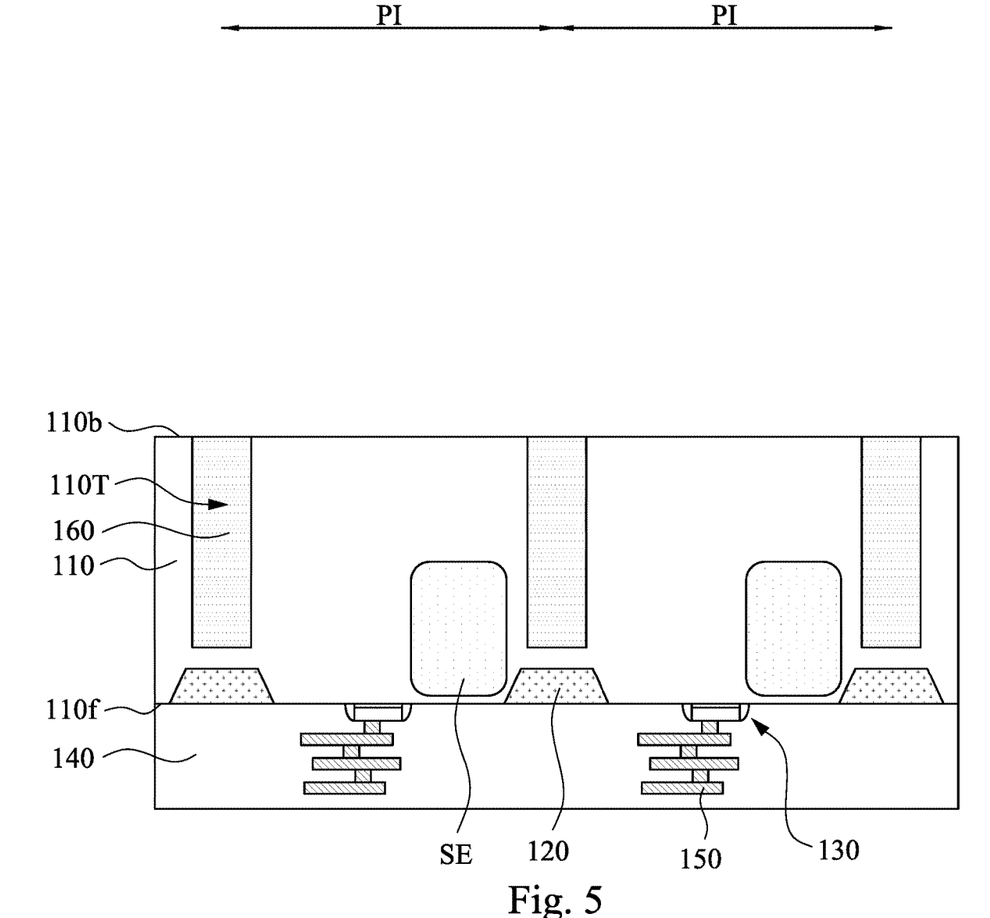

In some embodiments, the support substrate 900 may be removed from the back-side 110b of the substrate 110 after the BEOL process is complete. As shown in FIG. 5, after forming the dielectric structure 140 and the conductive interconnect layers 150 over the front-side 110f of the substrate 110, the structure as fabricated through FIG. 4 is first flipped about the horizontal axis, and the support substrate 900 is then removed. Thereafter, backside deep trench isolation (BDTI) structures 160 are formed in the substrate 110 through the backside 110b of the substrate 110. In some embodiments, the isolation features 160 may be formed by patterning the backside 110b of the substrate 110 to form trenches 110T in the substrate 110 using suitable photolithography and etching techniques, followed by filling the trenches 110T with one or more dielectric materials using suitable deposition techniques. A chemical mechanical polishing (CMP) process is then performed to planarize the dielectric materials with the backside 110b of the substrate 110, thus forming BDTI structures 160 in the substrate 110. The BDTI structures 160 may comprise, for example, oxide (e.g., $SiO_2$). In some embodiments, the BDTI structures 160 extending from the backside 110b are respectively aligned with the STI structures 120 extending from the front-side 110f. The BDTI structures 160 and the STI structures 120 may surround each of pixel regions PI, so as to provide for electrical isolation between neighboring pixel regions PI, which in turn may reduce cross-talk between neighboring pixel regions PI.

Figure 6A:
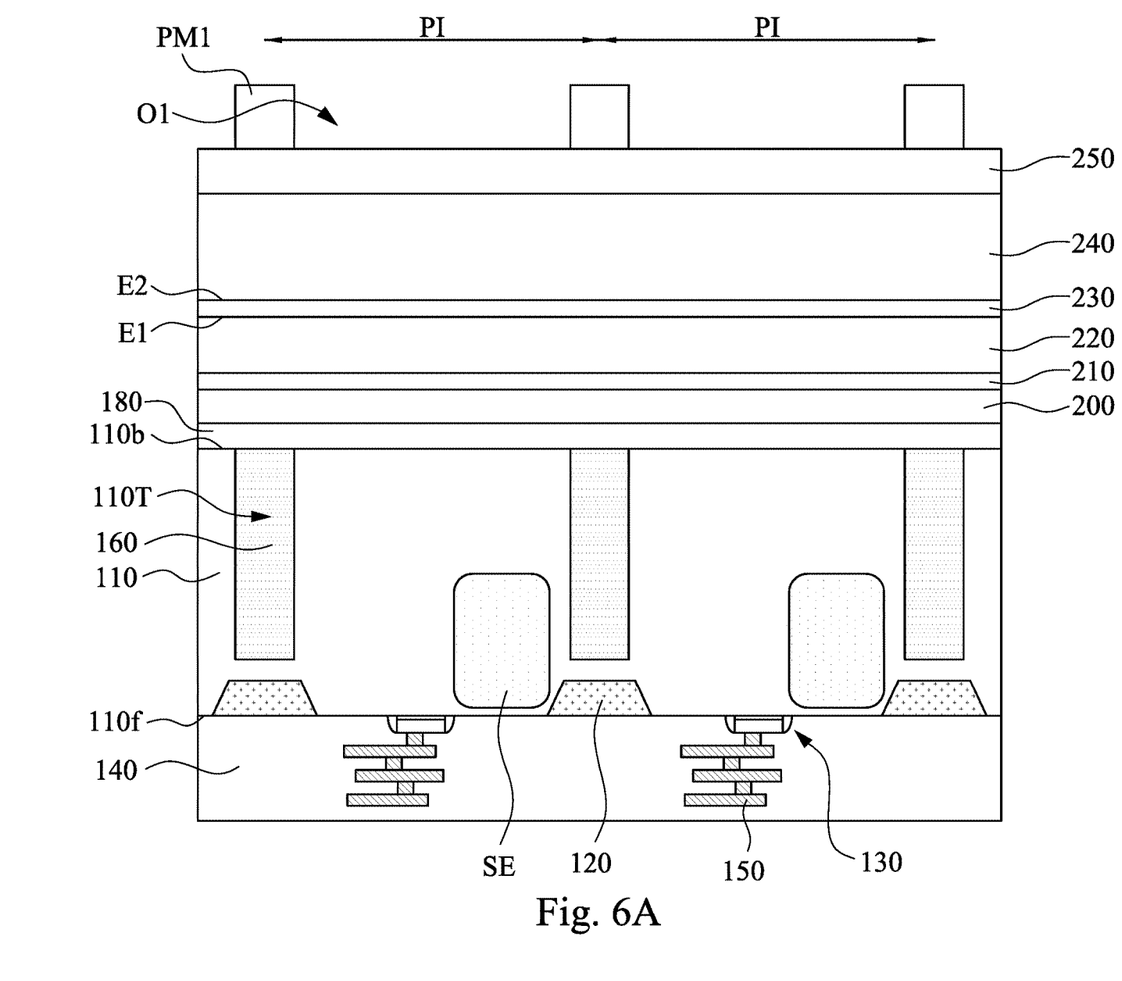
FIG. 6A is a cross-sectional view of an intermediate stage of fabricating the BSI-CIS structure according to various embodiments of the present disclosure.

Reference is made to FIG. 6A. An antireflective coating (ARC) 180 is optionally formed over the backside 110b of the substrate 100. The ARC 180 is a liner layer that can prevent incoming light rays from being reflected away from the substrate's backside 110b. The ARC 180 can include a high-k material (e.g., a material with a k-value higher than 3.9), such as hafnium oxide ($HfO_2$), tantalum pentoxide ($Ta_2O_5$), zirconium dioxide ($ZrO_2$), aluminum oxide ($Al_2O_3$), or any other high-k material. The ARC 180 can be deposited using a sputtering process, a CVD process, an ALD process, or any other suitable deposition technique. The thickness of ARC 180 can range, for example, from about 10 angstroms to about 500 angstroms.

After forming the ARC 180, a buffer layer 200 can be deposited over the ARC 180 to provide a substantially planar surface on which following layers 210-250 for forming a composite grid structure can be formed. In some embodiments, the buffer layer 200 comprises a material that is substantially optically transparent to the wavelengths of light intended to be received by the image sensing elements SE. In some embodiments, the buffer layer 200 comprises silicon oxide (e.g., $SiO_2$) or a low-k dielectric material. Low-k dielectric materials have a k-value (dielectric constant) lower than about 3.9. Some low-k dielectric materials have a k-value lower than about 3.5 and may have a k-value lower than about 2.5. In some embodiments, the buffer layer 200 may be deposited on the ARC 180 using, for example, CVD, ALD, PECVD, PEALD, PVD, the like, or combinations thereof. The thickness of the buffer layer 200 can range, for example, from about 500 angstroms and about 1500 angstroms. In some embodiments, the thickness of the buffer layer 200 is about 1000 angstroms.

Figure 8:
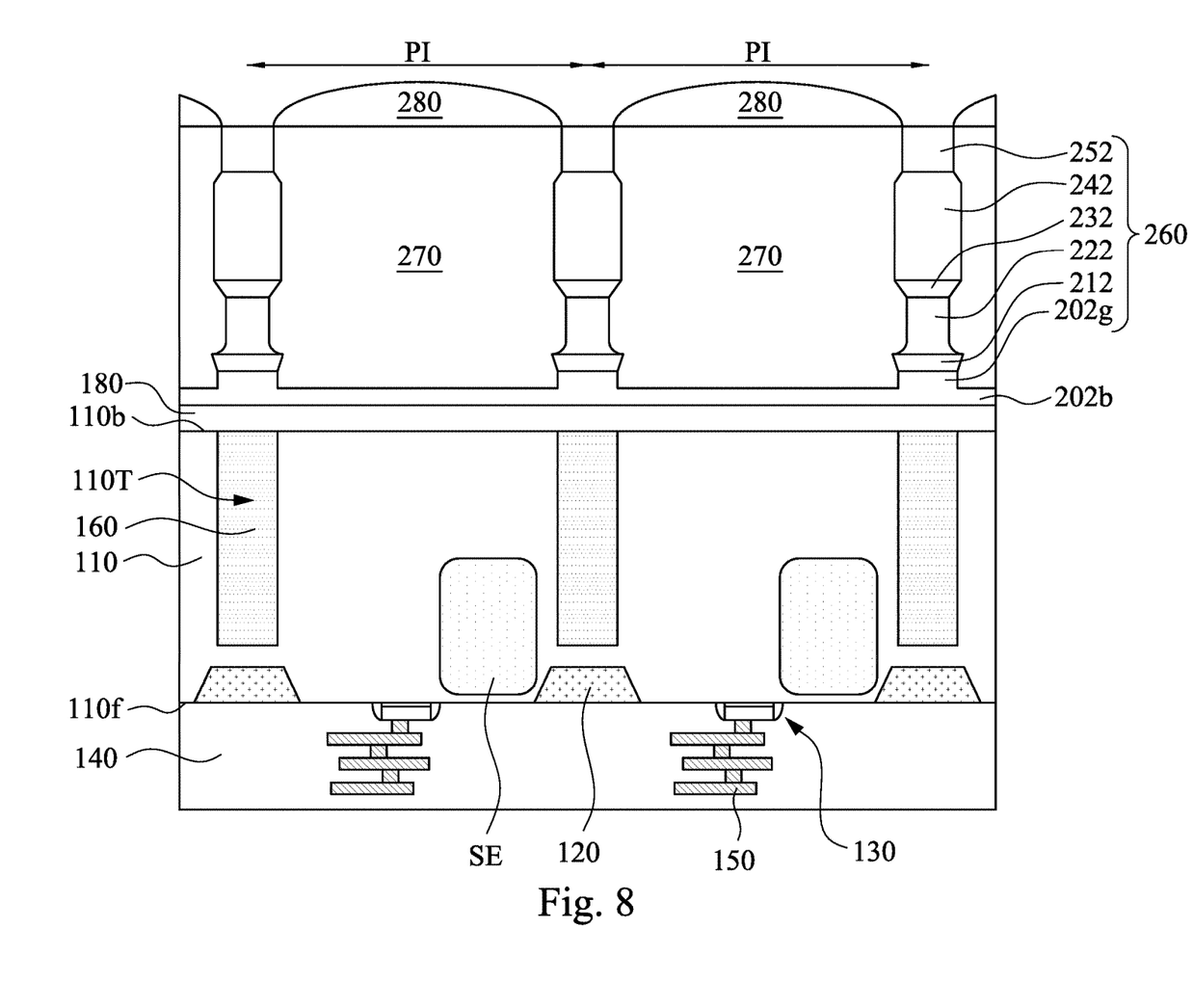
FIG. 8 is a cross-sectional view of an intermediate stage of fabricating the BSI-CIS structure according to various embodiments of the present disclosure.

A barrier layer 210 is formed over the buffer layer 200 using suitable deposition techniques. In some embodiments, one or more materials of the barrier layer 210 are chosen to reduce out-diffusion of metal within subsequently formed metal grids into the buffer layer 200. Moreover, the one or more materials of the barrier layer 210 are also chosen to provide improved adhesion strength between subsequently formed metal grids and underlying oxide materials in buffer layer 200. In some embodiments, the barrier layer 210 comprises nitride materials, such as, titanium nitride (TiN), tantalum nitride (TaN), the like, or combinations thereof, so as to achieve satisfactory metal-diffusion reduction and/or satisfactory improved adhesion strength. In some embodiments, the barrier layer 210 may be deposited on the buffer layer 200 using, for example, CVD, ALD, PECVD, PEALD, PVD, the like, or combinations thereof. The thickness of the barrier layer 210 can range, for example, from about 200 angstroms and about 400 angstroms. In some embodiments, the thickness of the barrier layer 210 is about 300 angstroms. An excessively thin barrier layer 210 may lead to insufficient suppression of out-diffusion of metal within metal grids and/or insufficient adhesion strength between metal grids and underlying oxide materials. An excessively thick barrier layer 210 may lead to unwanted voids formed in subsequently formed color filters (e.g., color filters 270 as shown in FIG. 8).

A metal grid layer 220 is formed over the barrier layer 210 using suitable deposition techniques. In some embodiments, the metal layer 108 comprises tungsten that has good gap-filling properties as well as good light reflectivitiy to isolate optical paths within subsequently formed color filters, although other suitable metals may be used. In some embodiments, the metal grid layer 220 may be deposited on the barrier layer 210 using, for example, CVD, ALD, PECVD, PEALD, PVD, the like, or combinations thereof. The thickness of the metal grid layer 220 can range, for example, from about 1000 angstroms and about 3000 angstroms. In some embodiments, the thickness of the metal grid layer 220 is about 2000 angstroms. An excessively thin metal grid layer 220 may lead to insufficient optical isolation for the subsequently formed color filters. An excessively thick metal grid layer 220 may lead to unwanted voids formed in subsequently formed color filters (e.g., color filters 270 as shown in FIG. 8).

An adhesion enhancement layer 230 is formed over the metal grid layer 220 using suitable deposition techniques. In some embodiments, the adhesion enhancement layer 230 includes a nitride material that provides improved adhesion strength to the underlying metal grid layer 220 and the overlying dielectric grid layer 240. In greater detail, if the metal grid layer 220 is formed from tungsten and the dielectric grid layer 240 is formed from oxide, the nitride layer 230 can provide stronger adhesion strength to the tungsten grid layer 220 and the oxide grid layer 240, compared with the case where the oxide grid layer 240 is directly deposited upon the tungsten grid layer 220. In this way, peeling defects in the composite grid structure subsequently formed from the layers 200-250 can be reduced, thus improving robustness of the composite grid structure and hence optical isolation between the pixel regions PI. In some embodiments, the adhesion enhancement layer 230 includes, for example, silicon nitride ($Si_{1-x}N$, x being greater than 0.01), titanium nitride (TiN), although other suitable materials that provides stronger adhesion strength to tungsten may be used. The adhesion enhancement layer 230 and the barrier layer 210 include a same chemical element (e.g., nitrogen), because they are both formed from nitride materials. Notably, in some embodiments, the barrier layer 210 is free of $Si_{1-x}N$, because optical performance of the BSI-CIS may be degraded when a $Si_{1-x}N$ grid is between the tungsten grid and the substrate's backside 110b.

The adhesion enhancement layer 230 may be deposited on the metal grid layer 220 using, for example, CVD, ALD, PECVD, PEALD, PVD, the like, or combinations thereof.

The thickness of the adhesion enhancement layer 230 can range, for example, from about 100 angstroms and about 2000 angstroms. In some embodiments, the thickness of the adhesion enhancement layer 230 is about 300 angstroms. An excessively thin adhesion enhancement layer 230 may lead to insufficient adhesion strength to tungsten. An excessively thick adhesion enhancement layer 230 may lead to unwanted voids formed in subsequently formed color filters (e.g., color filters 270 as shown in FIG. 8).

In some embodiments, the adhesion enhancement layer 230 is a single-layered film formed of a single material, such as $Si_{1-x}N$ or TiN. In some other embodiments, the adhesion enhancement layer 230 is a multi-layered film formed of a $Si_{1-x}N$ layer and a TiN layer stacked on the $Si_{1-x}N$ layer, or a TiN layer and a $Si_{1-x}N$ layer stacked on the TiN layer. In some embodiments where the adhesion enhancement layer 230 is formed from $Si_{1-x}N$, the $Si_{1-x}N$ layer 230 is opaque to light with a wavelength ranging from about 10 nm to about 1000 nm, thus improving optical isolation between neighboring pixel regions PI. In some embodiments, the $Si_{1-x}N$ layer 230 has a refractive index (RI) in a range from about 1.5 to about 2.5. In some embodiments where the adhesion enhancement layer 230 is formed of TiN, the TiN layer 230 has a sheet resistance (Rs) in a range from about $80\Omega$ per unit square area to about $120\Omega$ per unit square area.

A first dielectric grid layer 240 is formed over the adhesion enhancement layer 230 using suitable deposition techniques. In some embodiments, the first dielectric grid layer 240 includes a material that is substantially optically transparent to the wavelengths of light intended to be received by the image sensing elements SE but has a refractive index less than a refractive index of subsequently formed color filters. Due to the low refractive index, a dielectric grid formed from the first dielectric grid layer 240 can serve as a light guide to direct light to the color filters and to effectively increase size of the color filters. Further, due to the low refractive index, the dielectric grid formed from the first dielectric grid layer 240 can serve to provide optical isolation between neighboring pixel regions PI. Light within the color filters that strike boundary with the dielectric grid generally undergoes total internal reflection due to the refractive indexes difference. In some embodiments, the first dielectric grid layer 240 includes an oxide material, such as silicon oxide ($SiO_2$), hafnium oxide ($HfO_2$), although other suitable materials with a refractive index less than color filters may also be used.

Because the oxide material of the dielectric grid layer 240 is spaced from the underlying tungsten grid layer 220 by the adhesion enhancement layer 230, a composite grid structure subsequently formed from the layers 200-250 can be devoid of an oxide/tungsten interface that has weaker adhesion strength than that of the nitride/tungsten interface E1 and the nitride/oxide interface E2, thus reducing peeling defects in the composite grid structure. In some embodiments, the dielectric grid layer 240 may be deposited on the adhesion enhancement layer 230 using, for example, CVD, ALD, PECVD, PEALD, PVD, the like, or combinations thereof. The thickness of the dielectric grid layer 240 can range, for example, from about 2000 angstroms and about 4000 angstroms. In some embodiments, the thickness of the dielectric grid layer 240 is about 3200 angstroms, which may be greater than the thickness of the adhesive enhancement layer 230, the metal grid layer 220, the barrier layer 210 and the buffer layer 200. An excessively thin dielectric grid layer 240 may lead to insufficient gridline-to-gridline spacings for forming color filters with sufficient thickness. An excessively thick dielectric grid layer 240 may lead to unsatisfactory quantum efficiency performance because oxide materials of the dielectric grid layer 240 is optically transparent to the wavelengths of light intended to be received by the image sensing elements SE.

A second dielectric grid layer 250 is formed over the first dielectric grid layer 240 using suitable deposition techniques. The second dielectric grid layer 250 may act as a hard mask layer for patterning underlying layers to form a composite grid structure. In some embodiments, the second dielectric grid layer 250 includes silicon oxynitride (SiON), although other suitable materials with a different etch selectivity than the underlying first dielectric grid layer 240 may also be used. In some embodiments, the second dielectric grid layer 250 may be deposited on the first dielectric grid layer 240 using, for example, CVD, ALD, PECVD, PEALD, PVD, the like, or combinations thereof. The thickness of the second dielectric grid layer 250 can range, for example, from about 1000 angstroms and about 2000 angstroms. In some embodiments, the thickness of the second dielectric grid layer 250 is about 1500 angstroms.

Figure 6B:
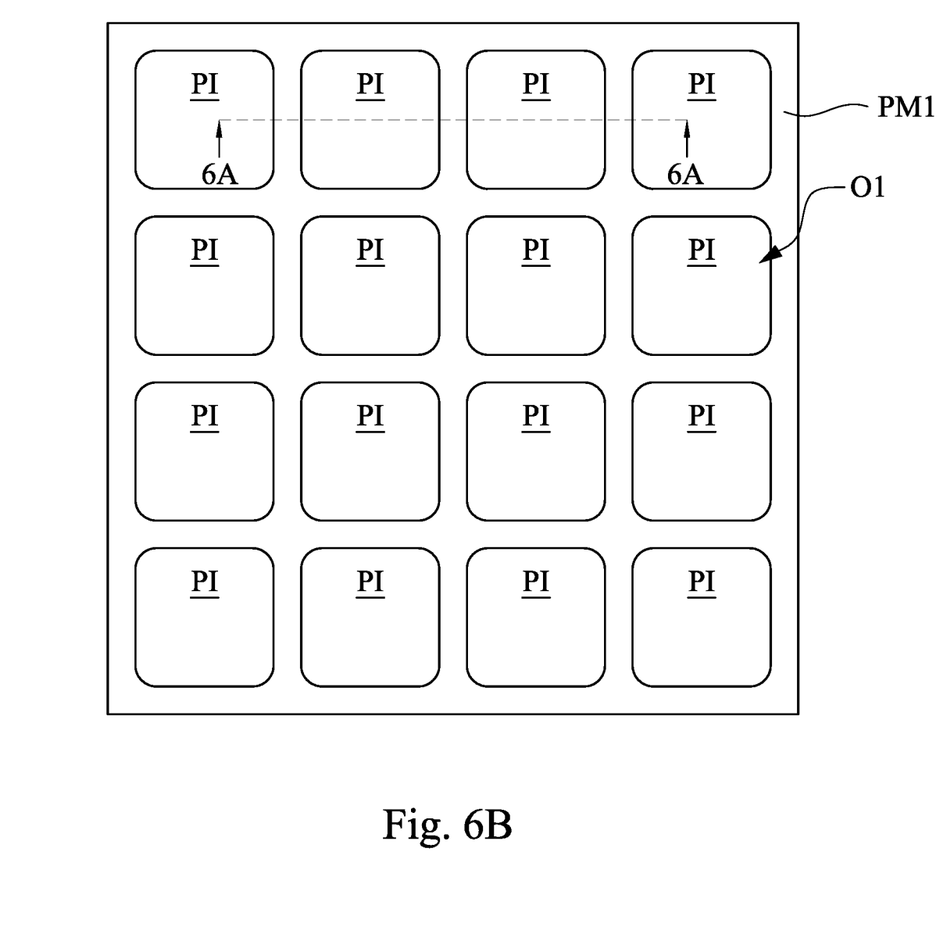
FIG. 6B is a top view of the intermediate stage of fabricating the BSI-CIS structure as shown in FIG. 6A.

FIG. 6A also illustrates a cross-sectional view of a patterned mask layer PM1 formed over the second dielectric grid layer 250, and FIG. 6B illustrates a top view of the patterned mask layer PM1. The patterned mask layer PM1 may comprise an organic material, such as a photoresist material, and may be formed using a spin-on coating process, followed by patterning the photoresist material to forming a plurality of holes O1 extending through the patterned mask layer PM1 using suitable lithography techniques. For example, photoresist material is irradiated (exposed) and developed to remove portions of the photoresist material. In greater detail, a photomask (not shown) may be placed over the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used. Thus, the holes O1 as illustrated in FIGS. 6A and 6B are formed in the patterned photoresist layer PM1. In some embodiments, the holes O1 are arranged in rows and columns such that the patterned photoresist layer PM has a grid pattern as illustrated in the top view of FIG. 6B.

Figure 7A:
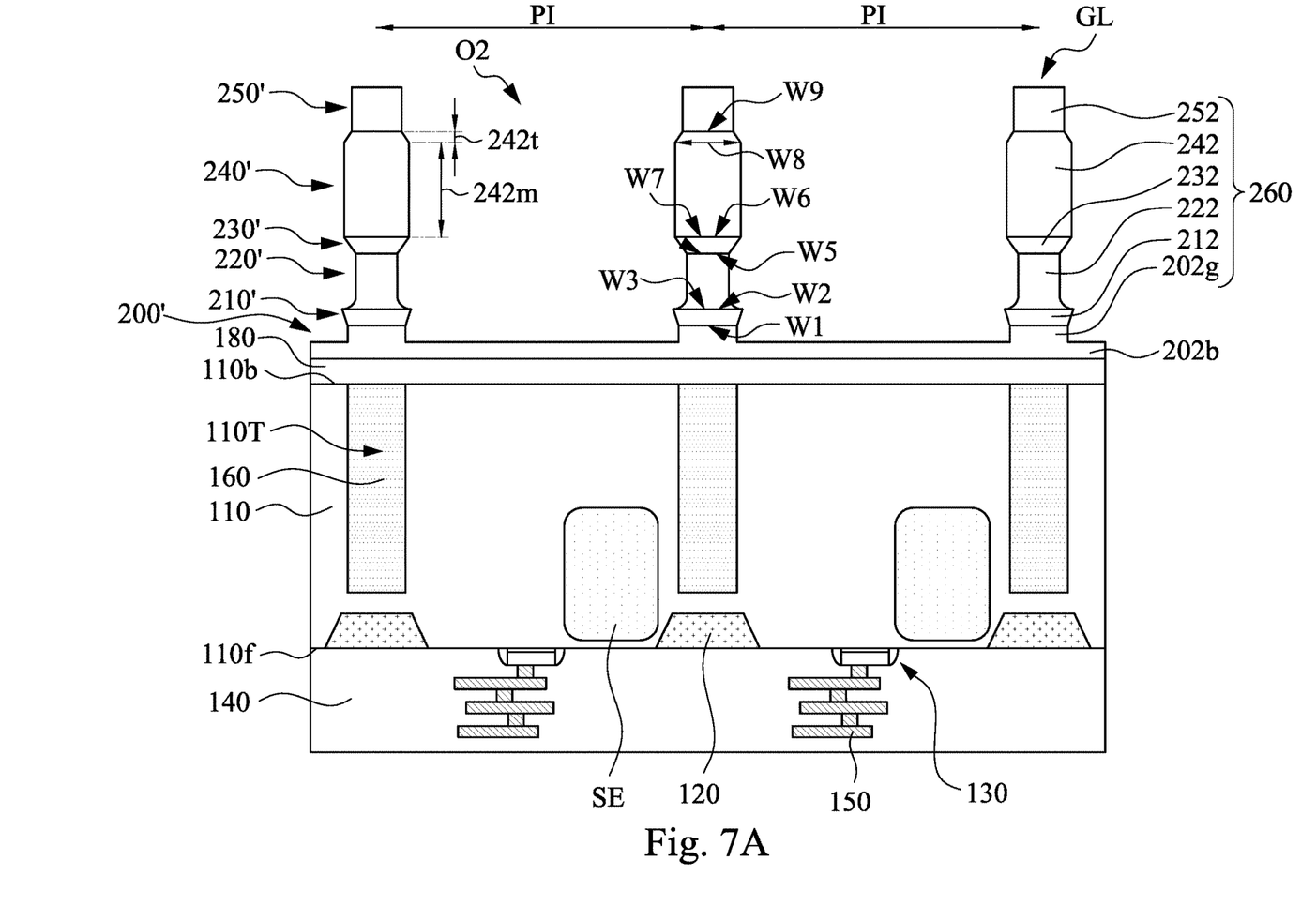
FIG. 7A is a cross-sectional view of an intermediate stage of fabricating the BSI-CIS structure according to various embodiments of the present disclosure.
Figure 7B:
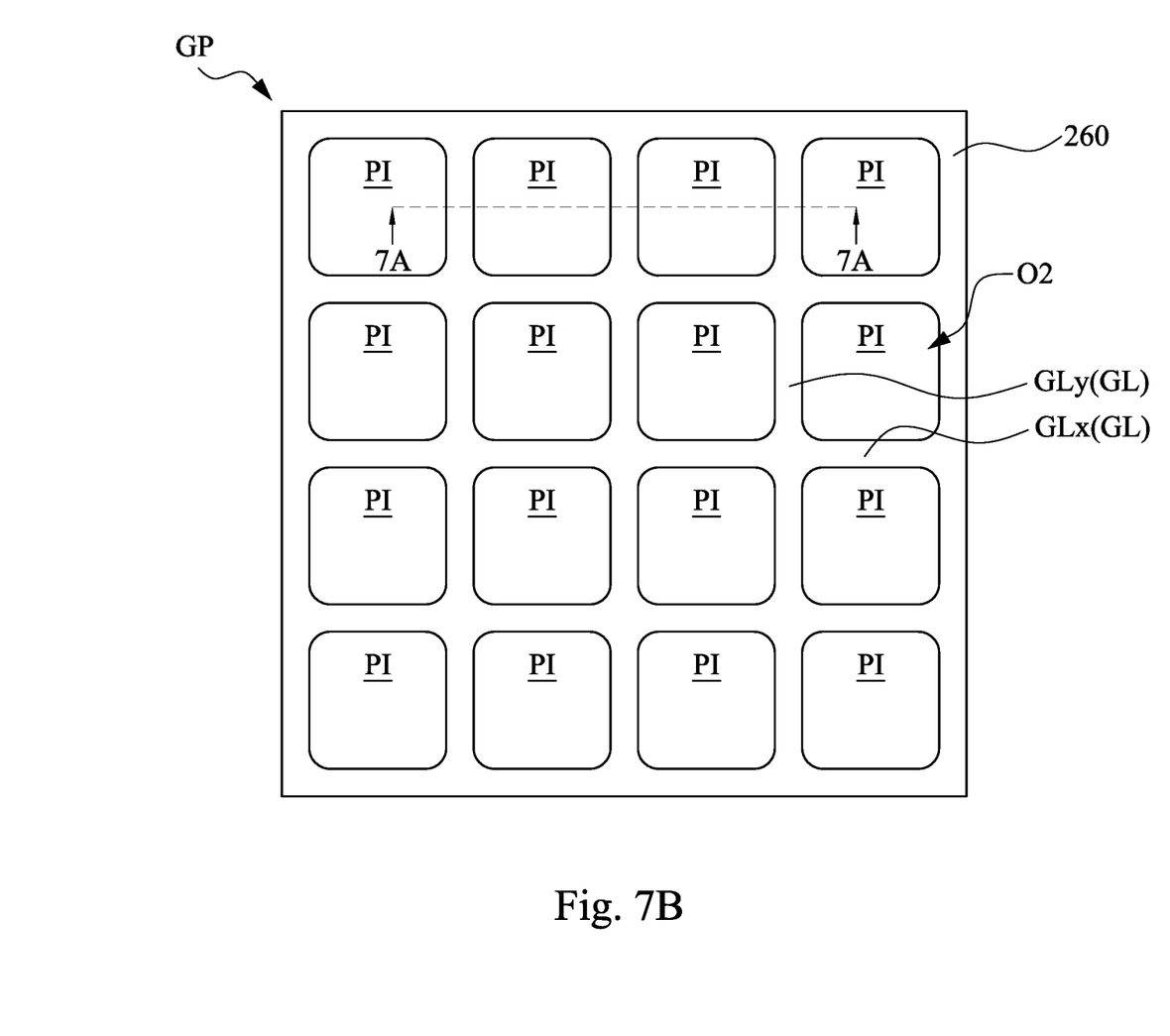
FIG. 7B is a top view of the intermediate stage of fabricating the BSI-CIS structure as shown in FIG. 7A.

After forming the patterned mask layer PM1, a patterning process is performed on the underlying layers 250-200 to transfer the pattern of the holes O1 in the patterned mask layer PM1 to the underlying layers 250-200, resulting in openings O2 extending through the patterned second dielectric grid layer 250', the patterned first dielectric grid layer 240', the patterned adhesion enhancement layer 230', the patterned meal grid layer 220', the patterned barrier layer 210' and the patterned buffer layer 200', as illustrated in FIGS. 7A and 7B, wherein FIG. 7A is a cross-sectional view of the resulting structure and FIG. 7B is a top view of the resulting structure.

Because the patterned layers 250'-200' are patterned using the mask layer PM1 (as illustrated in FIGS. 6A and 6B) as an etch mask, the patterned layers 250'-200' inherit the grid pattern from the mask layer PM1. In this way, the patterned second dielectric grid layer 250' includes a second dielectric grid 252 with a grid pattern GP when viewed from above as illustrated in FIG. 7B, the patterned first dielectric grid layer 240' includes a first dielectric grid 242 with the grid pattern GP when viewed from above as illustrated in FIG. 7B, the patterned adhesion enhancement layer 230' includes an adhesion enhancement grid 232 with the grid pattern GP when viewed from above as illustrated in FIG. 7B, and the patterned metal grid layer 220', the patterned barrier layer 210' and the patterned buffer layer 200' respectively include a metal grid 222, a barrier grid 212 and a buffer grid 202g with the grid pattern GP when viewed from above as illustrated in FIG. 7B. The stacked grids 202g, 212, 222, 232, 242, 252 can be in combination referred to as a composite grid structure 260 with the grid pattern GP when viewed from above as illustrated in FIG. 7B.

As shown in FIG. 7B, the grid pattern GP includes gridlines GL that define a plurality of openings O2 (interchangeably referred to as gridline-to-gridline spacings) that correspond to pixel regions PI in a one-to-one manner. Thus, the openings O2 may be arranged in a periodic pattern according to a pixel matrix corresponding to the image sensing elements SE. In some embodiments, the gridlines GLx extend in a direction perpendicular to the gridlines GLy. Because the adhesion enhancement grid 232 (e.g., nitride grid) includes the grid pattern GP comparable to that of the metal grid 222 (e.g., tungsten grid) and the first dielectric grid 242 (e.g., oxide grid), the adhesion enhancement grid 232 can completely space the metal grid 222 from the first dielectric grid 242. In this way, the composite grid structure 260 is devoid of an oxide/tungsten interface that exhibits poor adhesion strength, thus reducing peeling defects occurring in the composite grid structure 260 in a following cleaning step, as will be discussed in greater detail below.

In some embodiments, the patterning process for forming the composite grid structure 260 involves one or more etching processes, such as one or more dry etching processes, and/or one or more wet etching processes. For example, the patterning process may include a dry etching process (e.g., plasma etching) using a fluorine-containing etchant (e.g., $CF_4$, $SF_6$ or other fluorine-containing etchants). The dry etching process using fluorine-containing etchant may result in undesirable byproducts (e.g., tungsten-containing polymer residues) formed on sidewalls of the composite grid structure 260.

A megasonic cleaning process is then performed to remove the byproducts from the composite grid structure 260. The megasonic cleaning process includes using a mechanical agitation generator for agitating a wafer including the composite grid structure 260 in a cleaning solution, such as deionized water (DI water), other applicable solution, or the like, to enhance the cleaning process. The mechanical agitation generator may provide an agitation frequency in a range from about 1 MHz to about 100 MHz, although other suitable agitation frequency may be used. Notably, if a composite grid structure that includes a metal grid and an oxide grid contacting the metal grid experiences the megasonic cleaning process, the oxide grid may peel off from the metal grid due to the insufficient adhesion strength at the oxide/tungsten interface. However, the megasonic cleaning process will result in no or less peeling defects in the composite grid structure 260, because the composite grid structure 260 is devoid of any oxide/tungsten interface.

In some embodiments, the etching process does not break though the buffer layer 200', so that the buffer layer 200' includes a bottom portion 202b extending under the buffer grid 202g and across the substrate's backside 110b. In some other embodiments, the etching process may break through the buffer layer 200' to expose the ARC 180.

In some embodiments, a gridline GL of the barrier grid 212 formed from TiN has a width increasing as a distance from the substrate's backside 110b increases. For example, the TiN gridline has a bottom width W1 and a top width W2 greater than the bottom width W1. The bottom width W1 may be, for example, in a range from about 71 nm to about 89 nm (e.g., about 82 nm), and the top width W2 may be, for example, in a range from about 81 nm to about 99 nm (e.g., about 88 nm). Gridline of the metal grid 222 formed from tungsten has a width decreasing as a distance from the substrate's backside 110b increases. For example, the tungsten gridline has a bottom width W3 comparable to the top width W2 of the TiN grid 212 that is in a range from about 81 nm to about 99 nm, and has a top width W4 less than the bottom width W3. For example, the top width W4 may be in a range from about 54 nm to about 66 nm (e.g., about 63 nm).

In some embodiments, a gridline GL of the adhesion enhancement grid 232 formed from $Si_{1-x}N$ has a width increasing as a distance from the substrate's backside 110b increases. For example, the $Si_{1-x}N$ gridline has a bottom width W5 comparable to the top width W4 of the tungsten gridline that is in a range from about 54 nm to about 66 nm, and has a top width W6 greater than the bottom width W5. For example, the top width W6 may be in a range from about 76.5 nm to about 93.5 nm (e.g., about 88 nm).

In some embodiments, a gridline GL of the dielectric grid 242 formed from oxide has a main segment 242m extending upwardly from the adhesion enhancement grid 232 and a tapered top segment 242t extending upwardly from the main segment 242m. The main segment 242m has a width remaining substantially constant as a distance from the substrate's backside 110b increases, and the tapered top segment 242t has a width decreasing as a distance from the substrate's backside 110b increases. For example, the main segment 242m has a bottom width W7 comparable to the top width W6 of the $Si_{1-x}N$ gridline that may be in a range from 76.5 nm to about 93.5 nm, and a top width W8 comparable to the bottom width W7. The top segment has a bottom width comparable to the top width W8 of the main segment 242m, and a top width W9 less than its bottom width. For example, the top width W9 may be in a range from about 63 nm to about 77 nm (e.g., about 71 nm). In some embodiments, gridline of the dielectric grid 252 formed from SiON has a width remaining substantially constant as a distance from the substrate's backside 110b increases. For example, the SiNO gridline has a width in a range from about 63 nm to about 77 nm (e.g., about 71 nm).

Although the composite grid structure 260 has gridlines GL with the foregoing example nano-scale widths that may lead to increased risk of peeling or cracking, absence of oxide/tungsten interface in the composite grid structure 260 can reduce the risk of peeling or cracking. Therefore, improved robustness of the composite grid structure 260 can be achieved, even if widths of the gridlines continue to scale down to, for example, a range from about 10 angstroms to about 500 angstroms. In some embodiments, the adhesion enhancement grid 232 has a thickness (measured along a direction perpendicular to the backside 110b of the substrate 100) less than a thickness of the underlying metal grid 222 and the overlying dielectric grid 242. In some embodiments, a gridline GL is vertically aligned with a corresponding one of the DTI structures 160 and a corresponding one of the STI structures 120.

Once formation of the composite grid structure 260 is complete, color filters 270 corresponding to the image sensors under manufacture are formed in the openings O2. The resulting structure is illustrated in FIG. 8. In some embodiments, the color filters 270 fill the openings O2 with upper surfaces approximately even with an upper surface of the composite grid structure 260. The color filters 270 have assigned colors, such as red, green, and blue, and configured to transmit the assigned colors while blocking other colors.

The process for forming the color filters 270 may include, for each of the color assignments, forming a color filter layer and patterning the color filter layer. The color filter layer may be formed so as to fill the openings O2 and to cover the composite grid structure 260. The color filter layer may then be planarized and/or etched back to approximately even an upper surface of the composite grid structure 260, before patterning the color filter layer. In some embodiments, planarizing and/or etching back the color filter layer may result in the color filters 270 have a topmost position lower than a topmost position of the composite grid structure 260.

Once formation of the color filters 270 is complete, microlenses 280 are formed over the respective color filters 270. The process for forming the microlenses 280 may comprise forming one or more microlens layers over the color filters 270 and the composite grid structure 260. The microlens layer(s) may be formed using, for example, one or more of vapor deposition, ALD, spin coating, and the like. After forming a microlens layer, the microlens layer is patterned to define footprints of corresponding microlenses. For example, a photoresist layer masking select regions of the microlens layer may be formed over the microlens layer, used as a mask during an etch of the microlens layer, and subsequently removed. With the microlens layer patterned, one or more reflow and/or heating processes are performed on the patterned microlens layer to round corners of the patterned microlens layer, thus resulting in the microlenses with a round surface.

Figure 9:
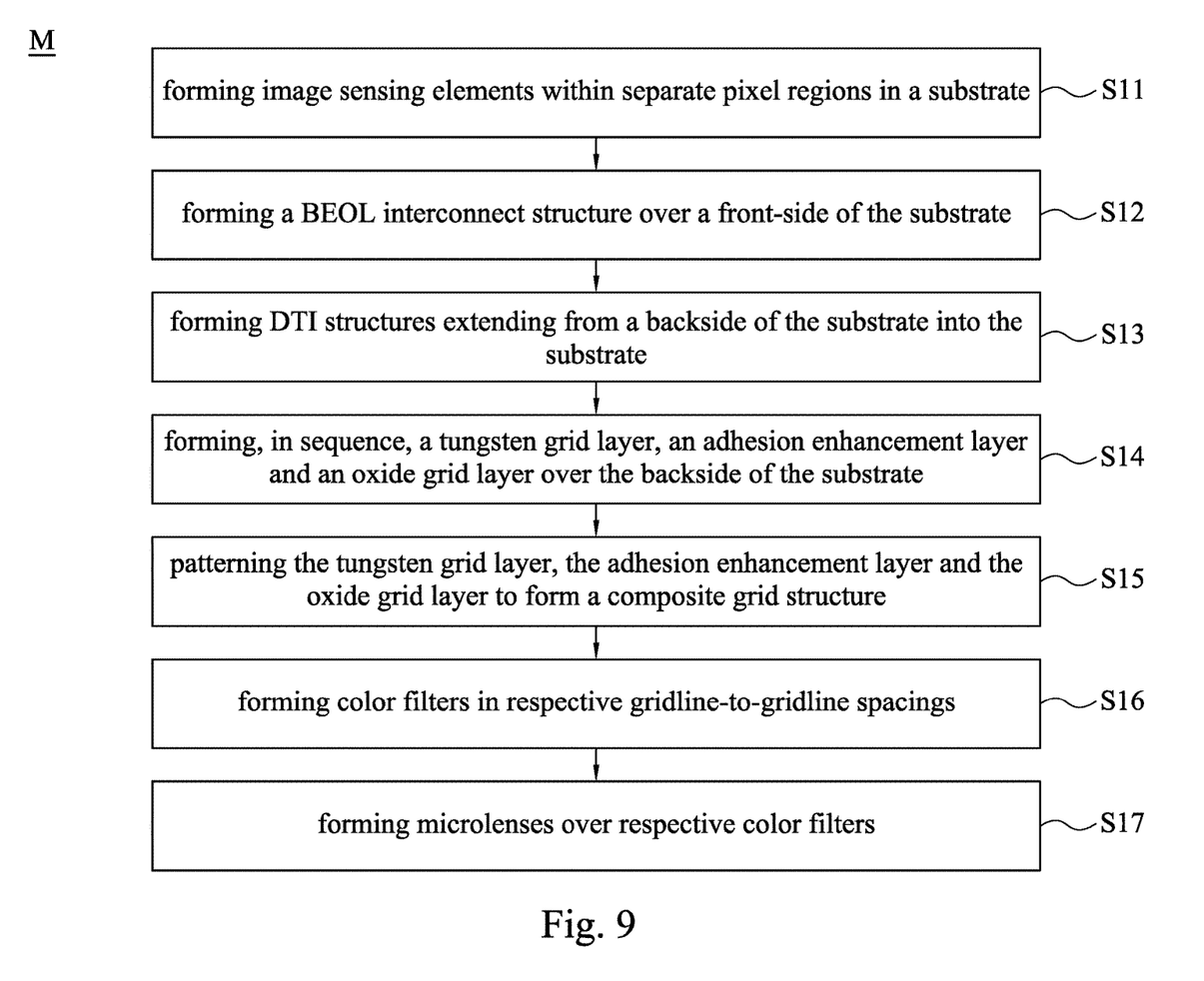
FIG. 9 illustrates a method of fabricating a BSI-CIS structure in accordance with some embodiments.

FIG. 9 illustrates a method M of forming a BSI-CIS structure in accordance with some embodiments. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S11, image sensing elements are formed within separate pixel regions in a substrate. FIGS. 1-3 illustrate a cross-sectional view of some embodiments corresponding to the act in blocks S11.

At block S12, a BEOL interconnect structure is formed over a front-side of the substrate. FIG. 4 illustrates a cross-sectional view of some embodiments corresponding to the act in blocks S12.

At block S13, DTI structures are formed extending from a backside of the substrate into the substrate. FIG. 5 illustrates a cross-sectional view of some embodiments corresponding to the act in blocks S13.

At block S14, a tungsten grid layer, an adhesion enhancement layer and an oxide grid layer are formed, in sequence, over the backside of the substrate. FIG. 6A illustrates a cross-sectional view of some embodiments corresponding to the act in blocks S14.

At block S15, the tungsten grid layer, the adhesion enhancement layer and the oxide grid layer are patterned to form a composite grid structure. FIGS. 7A and 7B respectively illustrate a cross-sectional view and a top view of some embodiments corresponding to the act in blocks S15.

At block S16, color filters are formed in respective gridline-to-gridline spacings. At block S17, microlenses are formed over respective color filters. FIG. 8 illustrates a cross-sectional view of some embodiments corresponding to the acts in blocks S16 and S17.

Figure 10:
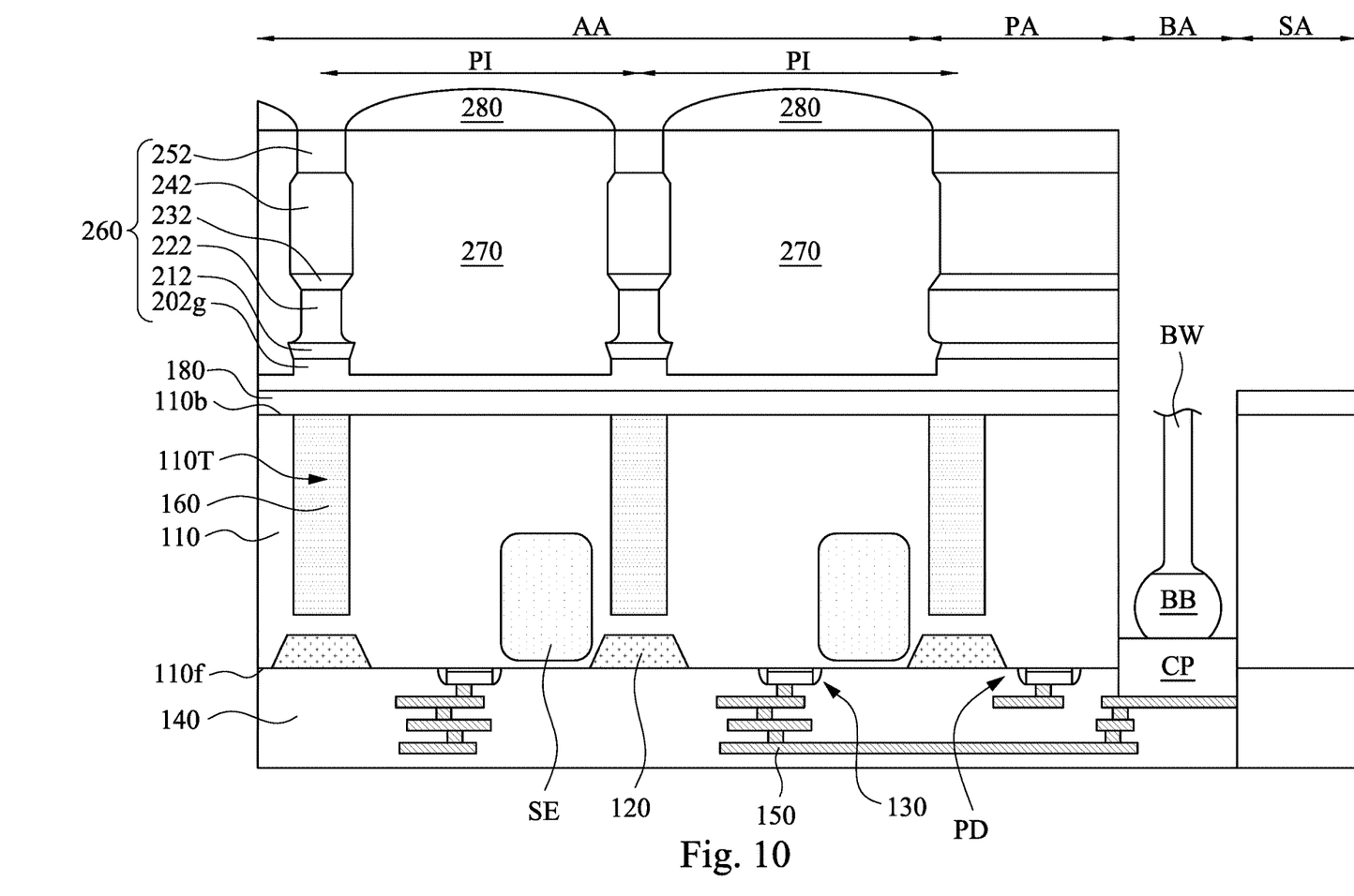
FIG. 10 is a cross-sectional view of a BSI-CIS structure according to some embodiments of the present disclosure.

FIG. 10 is a cross-sectional view of a BSI-CIS structure according to some embodiments of the present disclosure. The BSI-CIS structure includes a pixel array area AA, a periphery area PA, a bonding pad area BA (also referred to as an E-pad region), and a scribe line area SA. The pixel array area AA contains arrays of pixel regions PI. Each pixel region PI includes an image sensing element SE that can sense or detect radiation having specific wavelengths, which may correspond to lights of different colors. The periphery area PA may include other devices PD that is kept optically dark. For example, the devices PD may be a digital device, such as an application-specific integrated circuit (ASIC) device or a system-on-chip (SOC) device. The other devices PD may be a reference pixel that is used to establish a baseline of an intensity of light for the BSI-CIS structure. The bonding pad area BA may include one or more conductive bonding pads or E-pads CP, through which electrical connections between the BSI-CIS structure and outside devices may be established. For example, a bonding wire BW is attached to the conductive bonding pad CP through the bonding ball BB. The scribe line area SA may be the region that separates one semiconductor die that includes the bonding pad area BA, the periphery area PA, and the pixel array area AA from an adjacent semiconductor die (not illustrated). The scribe line area SA is cut in a later fabrication process to separate adjacent dies before the dies are packaged and sold as integrated circuit chips. The scribe line area SA is cut in such a way that the semiconductor devices in each die are not damaged.

Adding an adhesion enhancement grid to between a lower tungsten grid and an upper oxide grid will result in no or negligible impacts on the optical performance of the BSI-CIS integrated chip. For example, the adhesion enhancement grid may result in variation of less than 1% in quantum efficiency (QE), cross-talk performance, angular response, and/or signal-to-noise ratio of 10 dB (SNR10). The BSI-CIS devices as discussed above are some examples for describing the improved composite grid structure. However, the improved composite grid structure described above can also be integrated into other image sensors, such as FSI image sensors. In such scenarios, the improved composite structure will be disposed above the front-side 110f of the substrate 110, with the BEOL interconnect structure interposed between the composite structure and the substrate 110.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that peeling defects in the composite grid structure can be reduced by adding an adhesion enhancement grid to between a tungsten grid and an oxide grid. Another advantage is that the composite grid structure can remain robust after the megasonic cleaning process, because the composite grid structure is devoid of any oxide/tungsten interface that was susceptible to peeling during the megasonic cleaning process.

In some embodiments, an image sensor structure includes a semiconductor device, a plurality of image sensing elements formed in the semiconductor substrate, an interconnect structure formed on the semiconductor substrate, and a composite grid structure over the semiconductor substrate. The composite grid structure includes a tungsten grid, an oxide grid over the tungsten grid, and an adhesion enhancement grid spacing the tungsten grid from the oxide grid.

In some embodiments, an image sensor structure includes a semiconductor substrate, a plurality of photodiodes in the semiconductor substrate, an interconnect structure on the semiconductor substrate, and a composite grid structure on the semiconductor substrate. The composite grid structure includes an oxide grid and a metal grid between the oxide grid and the semiconductor substrate, and the composite grid structure is devoid of an oxide/metal interface.

In some embodiments, a method includes forming photodiodes in a substrate; forming an interconnect structure over the substrate; depositing a metal grid layer over the substrate, an adhesion enhancement layer over the metal grid layer, and an oxide grid layer over the adhesion enhancement layer; and etching the metal grid layer, the adhesion enhancement layer and the oxide grid layer to form metal gridlines, adhesion enhancement gridlines respectively extending above the metal gridlines, and oxide gridlines respectively extending above the adhesion enhancement gridlines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming photodiodes in a substrate;
   forming an interconnect structure over the substrate;
   forming a buffer layer over the substrate;
   forming a barrier layer over the buffer layer;
   after forming the barrier layer, depositing a metal grid layer over the substrate, an adhesion enhancement layer over the metal grid layer, and an oxide grid layer over the adhesion enhancement layer;
   etching the metal grid layer, the adhesion enhancement layer and the oxide grid layer to form metal gridlines, adhesion enhancement gridlines respectively extending above the metal gridlines, and oxide gridlines respectively extending above the adhesion enhancement gridlines; and
   etching the barrier layer and the buffer layer to form barrier gridlines respectively extending below the metal gridlines, and buffer gridlines respectively extending below the barrier gridlines.

2. The method of claim 1, wherein the adhesion enhancement layer is formed from a nitride material.

3. The method of claim 1, wherein the adhesion enhancement gridlines form nitride/metal interfaces with top surfaces of the metal gridlines.

4. The method of claim 1, wherein the metal gridlines each have a width that decreases as a distance from the substrate increases.

5. A method, comprising:
   forming a plurality of image sensing elements in a semiconductor substrate;
   forming an interconnect structure on the semiconductor substrate; and
   forming a composite grid structure over the semiconductor substrate, wherein the composite grid structure comprises a tungsten grid, an oxide grid over the tungsten grid, and an adhesion enhancement grid spacing the tungsten grid from the oxide grid, the adhesion enhancement grid is formed from a nitride material.

6. The method of claim 5, wherein the adhesion enhancement grid comprises gridlines each having a width that increases as a distance from the semiconductor substrate increases.

7. The method of claim 5, wherein the tungsten grid comprises gridlines each having a width that decreases as a distance from the semiconductor substrate increases.

8. The method of claim 5, wherein the oxide grid comprises gridlines each having a tapered top segment.

9. The method of claim 5, wherein the adhesion enhancement grid comprises gridlines each having a width in a range from about 10 angstroms to about 500 angstroms.

10. The method of claim 5, wherein the adhesion enhancement grid has a refractive index in a range from about 1.5 to about 2.5.

11. The method of claim 5, wherein the composite grid structure further comprises a barrier grid between the tungsten grid and the semiconductor substrate.

12. The method of claim 11, wherein the barrier grid and the adhesion enhancement grid have a same chemical element.

13. The method of claim 5, wherein the composite grid structure further comprises an oxynitride grid over the oxide grid.

14. A method, comprising:
   forming a plurality of photodiodes in a semiconductor substrate;
   forming an interconnect structure on the semiconductor substrate; and
   forming a composite grid structure on the semiconductor substrate, wherein the composite grid structure comprises an oxide grid and a metal grid between the oxide grid and the semiconductor substrate, and the composite grid structure is devoid of an oxide/metal interface.

15. The method of claim 14, wherein the composite grid structure further comprises a nitride grid forming a nitride/metal interface with a top surface of the metal grid.

16. The method of claim 15, wherein the nitride grid further forms a nitride/oxide interface with a bottom surface of the oxide grid.

17. The method of claim 15, wherein the nitride grid has a thickness less than a thickness of the metal grid.

18. The method of claim 15, wherein the nitride grid has a thickness less than a thickness of the oxide grid.

19. The method of claim 15, further comprising:
   forming a plurality of color filters extending through the nitride grid.

20. The method of claim 19, further comprising:
   forming a plurality of microlenses over the color filters, respectively.

* * * * *